(12) United States Patent
Yamamoto et al.

(10) Patent No.: US 12,585,203 B2
(45) Date of Patent: Mar. 24, 2026

(54) DETERMINING APPARATUS, PATTERN FORMING APPARATUS, AND METHOD FOR MANUFACTURING ARTICLE

(71) Applicant: CANON KABUSHIKI KAISHA, Tokyo (JP)

(72) Inventors: Takahiro Yamamoto, Tochigi (JP); Mitsuru Inose, Ibaraki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 74 days.

(21) Appl. No.: 18/450,457

(22) Filed: Aug. 16, 2023

(65) Prior Publication Data

US 2024/0085811 A1 Mar. 14, 2024

(30) Foreign Application Priority Data

Sep. 14, 2022 (JP) ................................. 2022-146177

(51) Int. Cl.
*G03F 7/00* (2006.01)

(52) U.S. Cl.
CPC ...... *G03F 7/70908* (2013.01); *G03F 7/70716* (2013.01); *G03F 7/70925* (2013.01)

(58) Field of Classification Search
CPC ............ G03F 7/70908; G03F 7/70716; G03F 7/7085; G03F 7/70925; G03F 7/707; G03F 9/7026; G03F 7/70483–70541; G03F 7/70605–706851; G03F 7/70733; G03F 7/7075; G03F 7/70783; G03F 7/708; G03F 7/70858; G03F 7/70916; G03F 7/70875; G03F 7/70991; G01N 21/94

USPC ............................. 355/18, 30, 52–55, 67–77
See application file for complete search history.

(56) References Cited

U.S. PATENT DOCUMENTS

| | | | |
|---|---|---|---|
| 9,599,903 B2 | 3/2017 | Nakamura et al. | |
| 2003/0211410 A1* | 11/2003 | Irie | G03F 7/70991 |
| | | | 430/311 |
| 2004/0227925 A1* | 11/2004 | Sato | G03B 27/58 |
| | | | 355/75 |

(Continued)

FOREIGN PATENT DOCUMENTS

| | | | |
|---|---|---|---|
| JP | 2008282885 A | * | 11/2008 |
| JP | 2015095602 A | | 5/2015 |
| KR | 1020150055558 A | | 5/2015 |

OTHER PUBLICATIONS

English translation of JP2008-282885, published Nov. 20, 2008. (Year: 2008).*

(Continued)

*Primary Examiner* — Christina A Riddle
(74) *Attorney, Agent, or Firm* — ROSSI, KIMMS & McDOWELL LLP

(57) ABSTRACT

In order to provide a determining apparatus capable of determining whether there is a foreign substance on a substrate stage with suppressing a decrease in productivity of an apparatus, the determining apparatus according to the present invention is configured to determine a state of a surface of each of a first substrate stage and a second substrate stage based on a first detection result of a substrate surface of a substrate mounted on the first substrate stage and a second detection result of the substrate surface of the substrate mounted on the second substrate stage.

19 Claims, 3 Drawing Sheets

(56)         References Cited

U.S. PATENT DOCUMENTS

| | | | |
|---|---|---|---|
| 2007/0085987 A1* | 4/2007 | Ottens | G03F 7/707 |
| | | | 355/53 |
| 2009/0103079 A1* | 4/2009 | Uto | G01N 21/9501 |
| | | | 356/237.4 |
| 2015/0131065 A1* | 5/2015 | Nakamura | G03F 7/2041 |
| | | | 356/237.4 |

OTHER PUBLICATIONS

Office Action issued in Taiwanese Patent Application No. 112132781 dated Dec. 1, 2025.

* cited by examiner

FIG. 1A
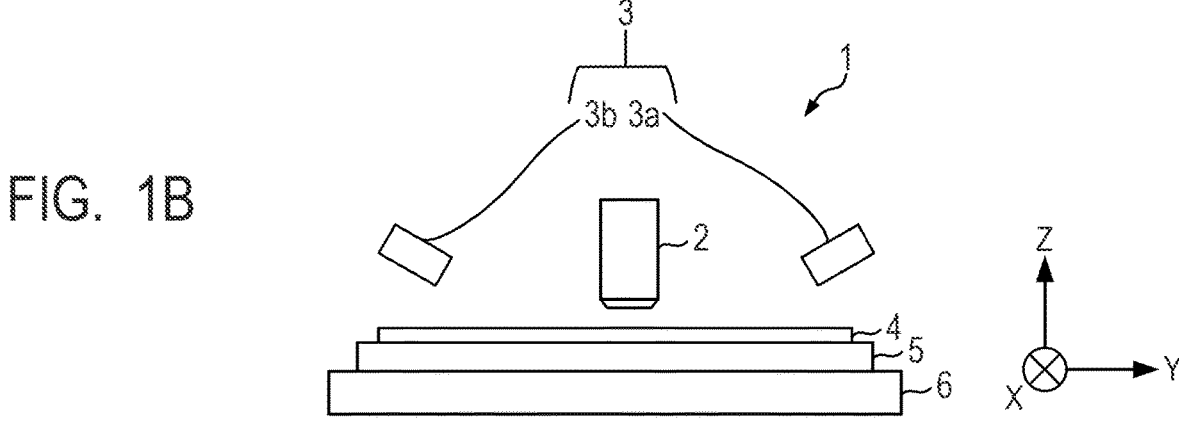
FIG. 1B
FIG. 1C
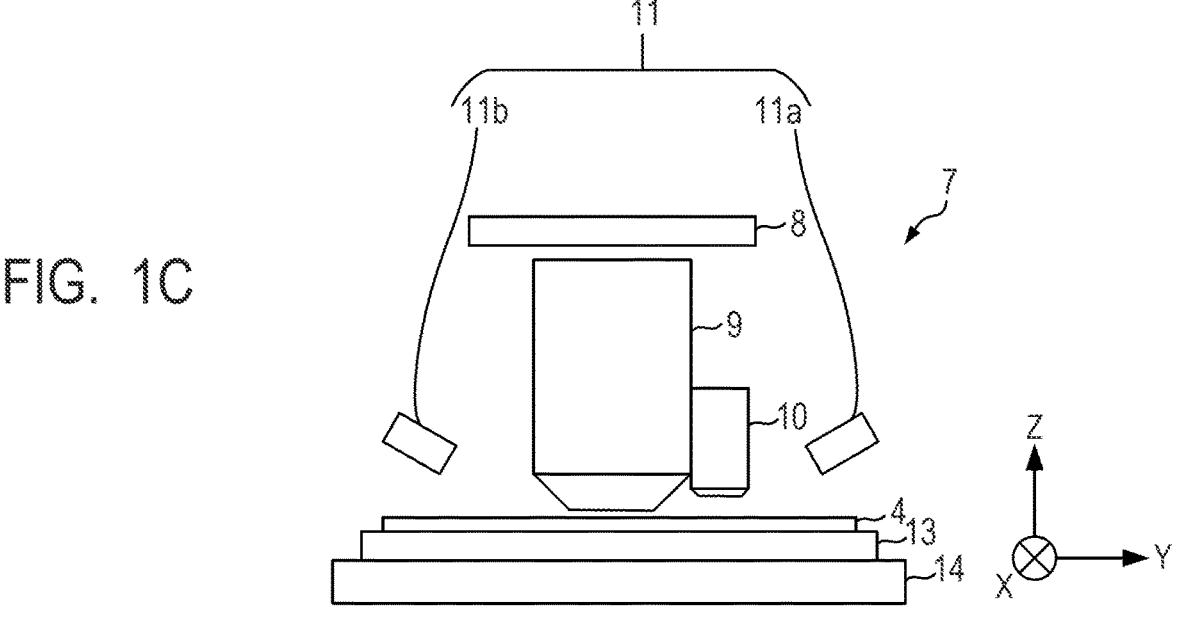

FIG. 2

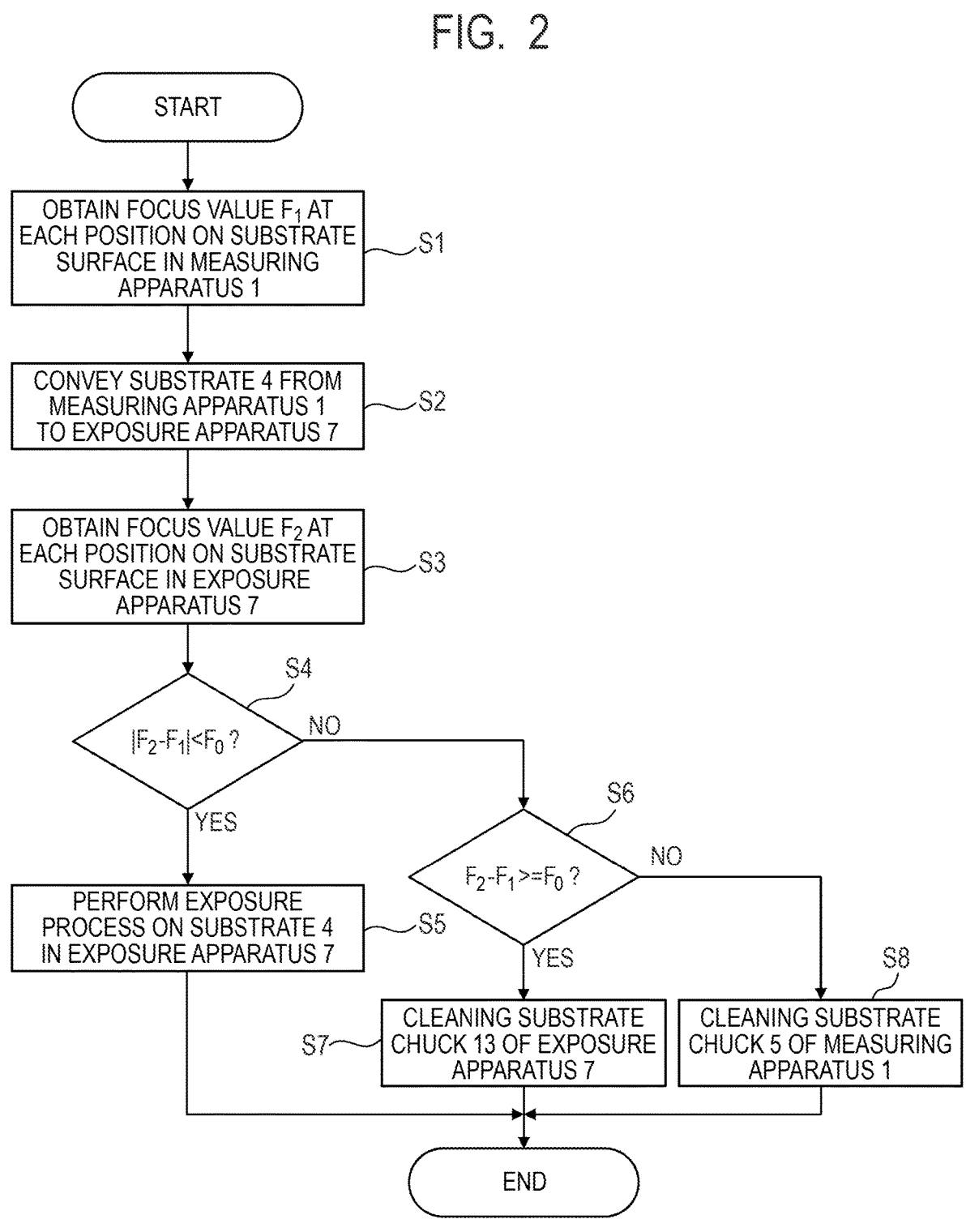

START

OBTAIN FOCUS VALUE $F_1$ AT EACH POSITION ON SUBSTRATE SURFACE IN MEASURING APPARATUS 1 — S1

CONVEY SUBSTRATE 4 FROM MEASURING APPARATUS 1 TO EXPOSURE APPARATUS 7 — S2

OBTAIN FOCUS VALUE $F_2$ AT EACH POSITION ON SUBSTRATE SURFACE IN EXPOSURE APPARATUS 7 — S3

S4
$|F_2 - F_1| < F_0$ ?

NO

YES

PERFORM EXPOSURE PROCESS ON SUBSTRATE 4 IN EXPOSURE APPARATUS 7 — S5

S6
$F_2 - F_1 >= F_0$ ?

NO

YES

S7 — CLEANING SUBSTRATE CHUCK 13 OF EXPOSURE APPARATUS 7

CLEANING SUBSTRATE CHUCK 5 OF MEASURING APPARATUS 1 — S8

END

DETERMINING APPARATUS, PATTERN FORMING APPARATUS, AND METHOD FOR MANUFACTURING ARTICLE

BACKGROUND OF THE INVENTION

Field of the Invention

The present invention is related to a determining apparatus.

Description of the Related Art

Conventionally, in an exposure apparatus, when there is a foreign substance on a substrate chuck for holding a substrate, a substrate surface of the substrate is raised at a position where the foreign substance is present, and the substrate surface is distorted in the vicinity of the position to reduce an overlay accuracy.

Accordingly, the exposure apparatus is required to detect and remove the foreign substance on the substrate chuck in order to suppress a decrease in the overlay accuracy.

Japanese Patent Application Laid-Open No. 2015-095602 discloses a determining apparatus for determining a presence of a foreign substance on a substrate chuck by obtaining a focus measurement value on a reference substrate held by the substrate chuck and comparing the obtained focus measurement value with a reference focus measurement value.

In the determining apparatus disclosed in Japanese Patent Application Laid-Open No. 2015-095602, a determination process is performed using the reference substrate by interrupting an exposure process in an exposure apparatus when it is necessary to determine whether there is the foreign substance on the substrate chuck in the exposure apparatus.

Accordingly, a time during which the exposure process can be performed in the exposure apparatus is reduced to reduce a productivity.

SUMMARY OF THE INVENTION

An object of the present invention is to provide a determining apparatus capable of determining whether there is a foreign substance on a substrate stage with suppressing a decrease in productivity of an apparatus.

The determining apparatus according to the present invention is configured to determine a state of a surface of each of a first substrate stage and a second substrate stage based on a first detection result of a substrate surface of a substrate mounted on the first substrate stage and a second detection result of the substrate surface of the substrate mounted on the second substrate stage.

Further features of the present invention will become apparent from the following description of exemplary embodiments with reference to the attached drawings.

BRIEF DESCRIPTION OF THE DRAWINGS

FIG. 1A is a block diagram of a substrate processing system provided with a determining apparatus according to the present invention.

FIG. 1B is a schematic sectional view of a measuring apparatus used in the present invention.

FIG. 1C is a schematic sectional view of an exposure apparatus used in the present invention.

FIG. 2 is a flowchart showing a process in the determining apparatus according to the present invention.

DESCRIPTION OF THE EMBODIMENTS

Figure 3A:
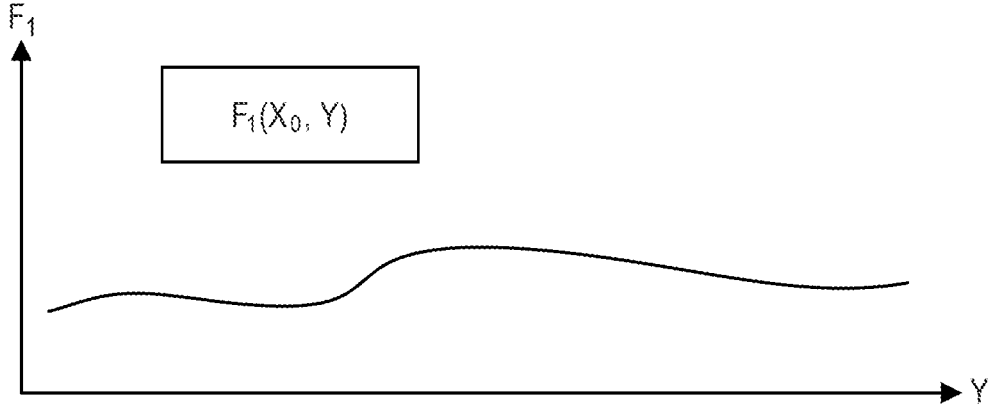
FIG. 3A is a graph showing an example of a detection result obtained by the determining apparatus according to the present invention.

Hereinafter, a determining apparatus according to the present invention is described in detail with reference to the accompanying drawings. It is noted that the drawings shown below are drawn on a scale different from the actual scale in order to facilitate understanding of the present invention.

Further, a direction perpendicular to a substrate surface of a substrate 4 is defined as a Z direction, and two directions orthogonal to each other in a plane parallel to the substrate surface are defined as an X direction and a Y direction.

Conventionally, a scanning exposure apparatus is used which performs an exposure process on a substrate by relatively scanning the substrate and an original with irradiating a substrate surface of the substrate with exposure light.

In the scanning exposure apparatus, focus values are generally measured at a plurality of positions back and forth in a scanning direction of a predetermined exposure region when the predetermined exposure region on the substrate surface is exposed.

Specifically, a plurality of detection light beams emitted from a light emitting unit of a focus detecting system are reflected at the plurality of positions in the exposure region, and then received by a light receiving unit of the focus detecting system.

Next, each height, namely each focus measurement value of the plurality of positions in the exposure region is obtained based on respective incident positions of the plurality of detection light beams on a light receiving surface of the light receiving unit.

Then, a position of a substrate stage for holding the substrate is controlled such that a shape of the exposure region coincides with an image plane of a projecting optical system based on the measured height at each of the plurality of positions in the exposure region.

As described above, the focus measurement value obtained by the focus detecting system gradually changes in accordance with the position on the substrate surface in a normal process.

On the other hand, when there is a foreign substance on the substrate surface or on a substrate chuck for holding the substrate on the substrate stage, the height of the substrate surface, namely the focus measurement value abruptly changes at the position where the foreign substance exists.

Further, the foreign substance on the substrate chuck is very noticed in a semiconductor manufacturing place, and the substrate chuck is periodically cleaned, or the substrate chuck is exchanged in some cases.

Conventionally, various techniques for determining whether there is the foreign substance on the substrate surface or the substrate chuck are known.

For example, an exposure apparatus is known which can determine whether there is the foreign substance on the substrate chuck by obtaining focus measurement values of a plurality of substrates including a normal exposed substrate and a reference substrate for checking the foreign substance to compare them with each other.

However, since the exposure apparatus performs a process of obtaining each focus measurement value of the plurality of substrates, a time during which the exposure apparatus can perform an exposure process is reduced to reduce a productivity.

Further, there is known an imprint apparatus capable of detecting the foreign substance present on a pattern surface of a mold by pickuping an image of the pattern surface using an image pickup unit.

Furthermore, there is known an imprint apparatus capable of detecting the foreign substance present on a substrate chuck by pickuping an image of a rear surface of the substrate held by the substrate chuck using an image pickup unit.

However, such imprint apparatuses are increased in a size and a cost since it is necessary to newly provide the image pickup unit.

An object of the present invention is to provide a determining apparatus capable of detecting the foreign substance present on the substrate chuck with a high yield.

FIG. 1A shows a block diagram of a substrate processing system 50 (a semiconductor manufacturing apparatus system) provided with a determining apparatus 20 according to the present invention.

Further, FIGS. 1B and 1C show schematic sectional views of an alignment/focus measuring apparatus (hereinafter referred to as a "a measuring apparatus") 1 and an exposure apparatus 7 provided in the substrate processing system 50, respectively.

As shown in FIG. 1B, the measuring apparatus 1 includes an alignment scope 2, a focus detecting system 3 (a surface position detector, a detecting unit), a substrate chuck 5 (a first substrate chuck) and a substrate stage 6 (a first substrate stage).

The alignment scope 2 measures a position in the XY plane of a substrate 4 by detecting an alignment mark (not shown) formed on a substrate surface of the substrate 4.

The focus detecting system 3 includes a light emitting unit 3a such as a light emitting diode (LED) and a light receiving unit 3b such as a charge coupled device (CCD).

In the focus detecting system 3, detection light is emitted from the light emitting unit 3a so as to be obliquely incident on the substrate surface along a direction non-parallel and non-perpendicular to the substrate surface of the substrate 4. Thereafter, the detection light reflected by the substrate surface is received by the light receiving unit 3b.

At this time, a height in the Z direction of the substrate surface, namely a surface position (a focus) of the substrate 4 can be measured based on the incident position of the detection light on a light receiving surface of the light receiving unit 3b.

The substrate chuck 5 (a first substrate chuck) is configured to suck and hold the substrate 4 by a vacuum suction.

The substrate stage 6 is configured to hold the substrate chuck 5 and to be movable to position the substrate 4 at least in the X direction, the Y direction and the Z direction.

With the above-described structure, the measuring apparatus 1 can measure a surface state of the substrate 4, namely a state of the substrate surface.

In particular, when an underlying pattern has been formed on the substrate surface of the substrate 4 in the preceding step, the alignment scope 2 and the focus detecting system 3 can be used to measure a distortion amount, a relief shape and the like on the substrate surface of the substrate 4.

That is, the measuring apparatus 1 can be a measuring apparatus for measuring the distortion amount, the relief shape and the like on the substrate surface of the substrate 4 before the exposure apparatus 7 performs an exposure process, for example.

As shown in FIG. 1C, the exposure apparatus 7 includes a projecting optical system 9, an alignment scope 10, a focus detecting system 11 (a surface position detector, a detecting unit), a substrate chuck 13 (a second substrate chuck) and a substrate stage 14 (a second substrate stage).

The projecting optical system (a reduction projecting optical system) 9 is configured to guide exposure light emitted from an illuminating optical system (not shown) and passing through a reticle (a mask) 8 to the substrate 4.

The focus detecting system 11 includes a light emitting unit 11a and a light receiving unit 11b, and has the same structure as that of the focus detecting system 3.

Further, the alignment scope 10, the substrate chuck 13 (a second substrate chuck) and the substrate stage 14 have the same structures as those of the alignment scope 2, the substrate chuck 5 and the substrate stage 6, respectively, so that a description thereof is omitted.

In the exposure apparatus 7, and exposure light passing through a reticle 8 mounted on a reticle stage (not shown) on which a circuit pattern (a pattern) is drawn (formed), is guided onto the substrate surface of the substrate 4 to transfer (reduction project) the pattern onto the substrate surface.

FIG. 2 shows a flowchart illustrating a process in the determining apparatus 20 according to the present invention.

Note that each step in the flowchart is controlled by a controller (not shown) provided in the determining apparatus 20, for example.

First, the measuring apparatus 1 performs a predetermined measurement on the substrate surface of the substrate 4, and then the measurement result (a first detection result) is obtained from the measuring apparatus 1 (step S1).

In the step S1, a focus value $F_1$ (a height Z, a surface position) at each position (X, Y) on the substrate surface of the substrate 4 is measured by using the focus detecting system 3, for example.

Next, the substrate 4 is conveyed from the measuring apparatus 1 to the exposure apparatus 7 by a conveying unit (not shown) (step S2), the exposure apparatus 7 performs a predetermined measurement on the substrate surface of the substrate 4, and then the measurement result (a second detection result) is obtained from the exposure apparatus 7 (step S3).

In the step S3, a focus value $F_2$ (a height Z, a surface position) at each position (X, Y) on the substrate surface of the substrate 4 is measured by using the focus detecting system 11, for example.

Then, the measurement result obtained in the step S1 and the measurement result obtained in the step S3 are compared with each other (step S4).

Figure 3B:
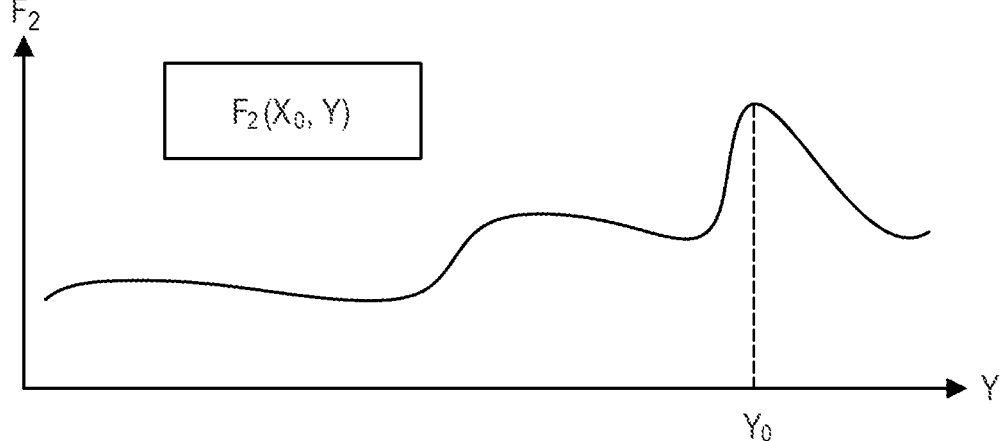
FIG. 3B is a graph showing an example of a detection result obtained by the determining apparatus according to the present invention.

FIGS. 3A and 3B show examples of the measurement result obtained from the measuring apparatus 1 in the step S1 and the measurement result obtained from the exposure apparatus 7 in the step S3, respectively.

Specifically, FIG. 3A shows the focus value $F_1(X_0, Y)$ at a predetermined position $X_0$ in the X direction and each position in the Y direction on the substrate surface of the substrate 4 in the measuring apparatus 1.

Further, FIG. 3B shows the focus value $F_2(X_0, Y)$ at the predetermined position $X_0$ in the X direction and each position in the Y direction on the substrate surface of the substrate 4 in the exposure apparatus 7.

As shown in FIGS. 3A and 3B, the focus value $F_1(X_0, Y)$ and the focus value $F_2(X_0, Y)$ are different from each other.

Specifically, a rapid increase in the vicinity of the position $Y_0$ which is not detected in the focus value $F_1(X_0, Y)$ is detected in the focus value $F_2(X_0, Y)$.

Note that the position of the substrate surface of the substrate 4 becomes higher, in other words, the substrate surface further shifts to a plus side in the Z direction, in still other words, a distance in the Z direction between the focus detecting system 3 and the substrate surface becomes smaller, the focus value $F_1$ measured by the focus detecting system 3 becomes larger. This also applies to the focus detecting system 11.

It is assumed that no change occurs on the substrate surface of the substrate 4, for example, no foreign substance newly occurs on the substrate surface of the substrate 4 when the substrate 4 is conveyed from the measuring apparatus 1 to the exposure apparatus 7 by the conveying unit (not shown).

At this time, this rapid increase of the focus value $F_2(X_0, Y)$ in the vicinity of the position $Y_0$ means that states of the surfaces of the substrate chuck 5 of the measuring apparatus 1 and the substrate chuck 13 of the exposure apparatus 7 are different from each other at the position $(X_0, Y_0)$.

That is, since the height Z at the position $(X_0, Y_0)$ of the substrate surface of the substrate 4 increases due to a presence of a foreign substance such as dust or dirt on the surface of the substrate chuck 13 of the exposure apparatus 7, the focus value $F_2(X_0, Y)$ in the vicinity of the position $Y_0$ increases.

Note that it is assumed that there is no foreign substance at the same position on the respective surfaces of the substrate chuck 5 of the measuring apparatus 1 and the substrate chuck 13 of the exposure apparatus 7 in the determining apparatus 20 according to the present invention.

Accordingly, in the step S4, a difference $F_2-F_1$ between the focus value $F_2$ and the focus value $F_1$ is calculated to compare it with a threshold value $F_0$ (a predetermined threshold value) at each position on the substrate surface of the substrate 4.

Specifically, in the step S4, it is determined whether an absolute value of the difference $|F_2-F_1|$ is less than the threshold value $F_0$ at each position on the substrate surface of the substrate 4.

If $|F_2-F_1|$ is less than the threshold value $F_0$ at any position on the substrate surface of the substrate 4 (Yes in step S4), the process proceeds to step S5.

In this case, it is determined that there is no foreign substance on a region on which the substrate 4 is mounted of each of the substrate chuck 5 of the measuring apparatus 1 and the substrate chuck 13 of the exposure apparatus 7, and the exposure apparatus 7 performs an exposure process on the substrate 4 (step S5), for example.

On the other hand, for example, if $|F_2-F_1|$ is equal to or larger than the threshold value $F_0$ at a predetermined position $X_0$ in the X direction and a predetermined position $Y_0$ in the Y direction on the substrate surface of the substrate 4 (No in the step S4), the process proceeds to step S6.

In the step S6, it is determined whether the difference $F_2-F_1$ is equal to or larger than the threshold value $F_0$ at the position $(X_0, Y_0)$ on the substrate surface of the substrate 4.

If the difference $F_2-F_1$ is equal to or larger than the threshold value $F_0$ at the position $(X_0, Y_0)$ on the substrate surface of the substrate 4, as in the examples of FIGS. 3A and 3B (Yes in the step S6), it is determined that there is a foreign substance at the position $(X_0, Y_0)$ on the surface of the substrate chuck 13 of the exposure apparatus 7. Then, the surface of the substrate chuck 13 is cleaned by using a cleaning unit (not shown) (step S7).

On the other hand, if the difference $F_2-F_1$ is not equal to or larger than the threshold value $F_0$ at the position $(X_0, Y_0)$ on the substrate surface of the substrate 4 (No in the step S6), it is determined that the difference $F_2-F_1$ is equal to or smaller than $-F_0$, namely a difference $F_1-F_2$ is equal to or larger than the threshold value $F_0$ at the position $(X_0, Y_0)$ on the substrate surface of the substrate 4. Accordingly, it is determined that there is a foreign substance at the position $(X_0, Y_0)$ on the surface of the substrate chuck 5 of the measuring apparatus 1, and the surface of the substrate chuck 5 is cleaned by using a cleaning unit (not shown) (step S8).

As described above, the determining apparatus 20 according to the present invention obtains a first detection result about the substrate surface of the substrate 4 mounted on the substrate chuck 5 of the measuring apparatus 1.

Further, it obtains a second detection result about the substrate surface of the substrate 4 mounted on the substrate chuck 13 of the exposure apparatus 7.

Then, based on the first detection result and the second detection result, it is possible to determine an abnormality in a state of respective surfaces of the substrate chuck 5 and the substrate chuck 13 such as a presence of a foreign substance.

Thereby, the determining apparatus 20 according to the present invention can reduce the number of substrates mounted on the substrate chuck 13 in order to check the state of the surface of the substrate chuck 13 of the exposure apparatus 7 and the number of detections of the substrate surface as compared with a conventional apparatus.

Accordingly, it is possible to suppress a decrease in a time during which an exposure process can be performed, namely a productivity in the exposure apparatus 7.

Although the determining apparatus 20 according to the present invention obtains detection data of a height (a focus) at each position on the substrate surface of the substrate 4 by using the focus detection system, the present invention is not limited thereto.

That is, the determining apparatus 20 according to the present invention may obtain image data of the substrate surface by pickuping an image of the substrate surface of the substrate 4 by using an image pickup unit to visually detect a bump or the like at a predetermined position on the substrate surface of the substrate 4 from the obtained image data, for example.

Further, a height Z increases, so that the focus value F increases at a predetermined position $(X_0, Y_0)$ on the substrate surface of the substrate 4 due to a presence of a foreign substance on the surface of the substrate chuck in the above description, the present invention is not limited thereto.

That is, the determining apparatus 20 according to the present invention may detect that the height Z decreases, so that the focus value F decreases at the predetermined position $(X_0, Y_0)$ on the substrate surface of the substrate 4 due to a presence of a recess such as a scratch on the surface of the substrate chuck.

For example, when it is determined that the difference $F_2-F_1$ is equal to or larger than the threshold value $F_0$ at the position $(X_0, Y_0)$ in the step S6, the cause may be not a foreign substance on the surface of the substrate chuck 13 of the exposure apparatus 7 but the recess formed on the surface of the substrate chuck 5 of the measuring apparatus 1.

At this time, even when the surface of the substrate chuck 13 is cleaned in the step S7, it is still determined that the difference $F_2-F_1$ is equal to or larger than the threshold value $F_0$ at the position $(X_0, Y_0)$ in the step S6.

In this case, it can be determined that there is the recess on the surface of the substrate chuck 5 of the measuring apparatus 1 to instruct the measuring apparatus 1 to replace the substrate chuck 5.

Further, a conveyed position of the substrate 4 on the substrate chuck 5 of the measuring apparatus 1 by a conveying unit (not shown) and that of the substrate 4 on the substrate chuck 13 of the exposure apparatus 7 by a conveying unit (not shown) may be different from each other.

In other words, a relative position in the XY plane of the substrate surface of the substrate 4 mounted on the substrate chuck 5 with respect to the focus detecting system 3 and that of the substrate surface of the substrate 4 mounted on the substrate chuck 13 with respect to the focus detecting system 11 may be different from each other.

At this time, the focus value $F_1$ at each position (X, Y) on the substrate surface of the substrate 4 mounted on the substrate chuck 5 and the focus value $F_2$ at each position (X, Y) on the substrate surface of the substrate 4 mounted on the substrate chuck 13 are different from each other.

In this case, the conveyed position of the substrate 4 on the substrate chuck 5 of the measuring apparatus 1 by the conveying unit (not shown) and that of the substrate 4 on the substrate chuck 13 of the exposure apparatus 7 by the conveying unit (not shown) are measured in advance.

Then, at least one of a position of the substrate surface when the substrate 4 is mounted on the substrate chuck 5 and that when the substrate 4 is mounted on the substrate chuck 13 may be corrected based on a difference between the measured conveyed positions.

In other words, the difference of the focus values $F_2-F_1$ may be calculated at each position (X, Y) after at least one of an XY coordinate system for the measurement data obtained in the step S1 and that for the measurement data obtained in the step S3 is corrected.

Further, the determining apparatus 20 according to the present invention may obtain an image of the surface of the substrate chuck 5 by pickuping the image of the surface of the substrate chuck 5 using an image pickup unit when it is determined that there is a foreign substance on the surface of the substrate chuck 5 of the measuring apparatus 1 to increase an accuracy of the determination.

Similarly, the determining apparatus 20 according to the present invention may obtain an image of the surface of the substrate chuck 13 by pickuping the image of the surface of the substrate chuck 13 using an image pickup unit when it is determined that there is a foreign substance on the surface of the substrate chuck 13 of the exposure apparatus 7 to increase an accuracy of the determination.

As described above, the difference of the focus values $F_2-F_1$ obtained by the determining apparatus 20 according to the present invention corresponds to a difference between a height of the substrate surface of the substrate 4 mounted on the substrate chuck 5 and that of the substrate surface of the substrate 4 mounted on the substrate chuck 13.

That is, the difference of the focus values corresponds to a size of a foreign substance present on one of the substrate chuck 5 and the substrate chuck 13.

Accordingly, a plurality of threshold values corresponding to a plurality of sizes of the foreign substance may be provided with respect to the difference of the focus values to perform a determination process of not performing cleaning when the difference of the focus values exceeds only relatively small threshold values, namely the existing foreign substance is small.

Although the determining apparatus 20 for determining a presence of a foreign substance on respective surfaces of the substrate chuck 5 of the measuring apparatus 1 and the substrate chuck 13 of the exposure apparatus 7 has been described above, the present invention is not limited thereto.

That is, the determining apparatus 20 according to the present invention can similarly determine the presence of the foreign substance on respective surfaces of a substrate chuck of a first stage and a substrate chuck of a second stage provided in an exposure apparatus with a two stage structure.

Further, the determining apparatus 20 according to the present invention can similarly determine the presence of the foreign substance on respective surfaces of a substrate chuck of a first exposure apparatus and a substrate chuck of a second exposure apparatus.

Furthermore, the determining apparatus 20 according to the present invention can similarly determine the presence of the foreign substance on respective surfaces of three or more substrate chucks.

In addition, the determining apparatus 20 according to the present invention can similarly determine the presence of the foreign substance on the surface of a member (a component) on which the substrate is mounted other than the substrate chuck.

Although the determining apparatus 20 for determining the presence of the foreign substance on the surface of the substrate chuck 13 of the exposure apparatus 7 has been described above, the present invention is not limited thereto.

That is, the determining apparatus 20 according to the present invention may determine the presence of the foreign substance on a surface of a substrate chuck provided in a pattern forming apparatus such as an imprint apparatus or drawing apparatus.

The imprint apparatus referred to herein is an apparatus which brings an imprint material supplied onto a substrate and a mold into contact with each other, and then applies curing energy to the imprint material to form a pattern of a cured product to which a pattern of the mold is transferred.

Further, the drawing apparatus referred to herein is an apparatus which forms a pattern (a latent image pattern) on a substrate by drawing on the substrate using a charged particle beam (an electron beam) or a laser beam.

In the above description, although the determining apparatus 20 according to the present invention is provided independently of each of the measuring apparatus 1 and the exposure apparatus 7, the present invention is not limited thereto.

That is, the determining apparatus 20 according to the present invention may be incorporated in the measuring apparatus 1 or the exposure apparatus 7.

Further, although the determining apparatus 20 according to the present invention determines the presence of the foreign substance on each of the substrate chuck 5 of the measuring apparatus 1 and the substrate chuck 13 of the exposure apparatus 7 by using the same substrate 4, the present invention is not limited thereto, and a plurality of substrates can be used.

For example, first, a focus value at each position on respective substrate surfaces is obtained in a state in which each of a plurality of substrates is mounted on the substrate chuck 5 of the measuring apparatus 1.

Then, for example, when the focus values at the same position on the plurality of substrate surfaces are equal to or larger than a threshold value by comparing the focus values at each position on the respective substrate surfaces with each other, it can be determined that there is the foreign substance at the position on the substrate chuck 5.

In this way, when it is determined that there is the foreign substance on the substrate chuck 5 of the measuring apparatus 1, the surface of the substrate chuck 5 is cleaned.

Thereafter, it can be determined that there is the foreign substance on the substrate chuck 13 of the exposure apparatus 7, for example, when $|F_2-F_1|$ is equal to or larger than a threshold value $F_0$ at a predetermined position $(X_0, Y_0)$ on the substrate surface of the substrate 4 in the step S4 by performing the process shown in FIG. 2.

That is, in this case, it is possible to instruct the exposure apparatus 7 to clean the surface of the substrate chuck 13 without performing the process in the step S6.

Further, the position of the foreign substance present on the substrate surface of each substrate can be obtained by mounting each of a plurality of substrates on the substrate chuck 5 of the measuring apparatus 1 to obtain a focus value at each position on respective substrate surfaces thereof.

This can also improve an accuracy of determining the presence of the foreign substance on each of the substrate chuck 5 of the measuring apparatus 1 and the substrate chuck 13 of the exposure apparatus 7.

Although preferred embodiments have been described above, the present invention is not limited to these embodiments, and various modifications and changes can be made within the scope of the gist of the present invention.

In addition, although the determining apparatus according to the present invention has been described above, a method for determining a presence of a foreign substance, a program for executing the method, and a computer readable recording medium in which the program is recorded are included in the scope of the present invention.

According to the present invention, it is possible to provide a determining apparatus capable of determining whether there is a foreign substance on a substrate stage with suppressing a decrease in productivity of an apparatus.

[Method for Manufacturing an Article]

The method for manufacturing an article according to the present invention is suitable for manufacturing the article including a microdevice such as a semiconductor device or an element with a microstructure.

The method for manufacturing the article according to the present invention includes a step of forming a latent image pattern on a photoresist applied to a substrate by using the exposure apparatus 7 (an exposing step of exposing the substrate).

Further, the method for manufacturing the article according to the present invention includes a developing step (a processing step) of developing the substrate on which the latent image pattern is formed in the exposing step.

Furthermore, the method for manufacturing the article according to the present invention includes other well-known manufacturing steps (oxidation, film formation, vapor deposition, doping, planarization, etching, photoresist peeling, dicing, bonding, packaging and the like) performed on the substrate developed in the developing step.

The method for manufacturing the article according to the present invention is advantageous in at least one of a performance, a quality, a productivity and a production cost of the article as compared to a conventional method.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-146177, filed Sep. 14, 2022, which is hereby incorporated by reference herein in its entirety.

What is claimed is:

1. A determining apparatus comprising:
a controller configured to:
obtain a first detection result which is a result of detecting a surface of a first substrate when the first substrate is placed on a first substrate stage;
obtain a second detection result which is a result of detecting the surface of the first substrate when the first substrate is placed on a second substrate stage; and
determine an abnormality of respective surfaces of the first substrate stage and the second substrate stage based on a comparison of the first detection result and the second detection result.

2. The determining apparatus according to claim 1, wherein the controller is configured to determine whether there is a foreign substance on the surface of each of the first substrate stage and the second substrate stage based on a height at each position of the surface of the first substrate when the first substrate is placed on the first substrate stage, and a height at each position of the surface of the first substrate when the first substrate is placed on the second substrate stage.

3. The determining apparatus according to claim 2, wherein the controller is configured to cause a detecting unit to detect a focus value at each position on the surface of the first substrate when the first substrate is placed on the first substrate stage, and a focus value at each position on the surface of the first substrate when the first substrate is placed on the second substrate stage.

4. The determining apparatus according to claim 3, wherein the detecting unit is configured to detect the focus value by emitting detection light toward the surface of the first substrate along a direction non-parallel and non-perpendicular to the surface of the first substrate and receiving the detection light reflected by the surface of the first substrate.

5. The determining apparatus according to claim 3, wherein the controller is configured to calculate a difference between the focus value at each position on the surface of the first substrate when the first substrate is placed on the first substrate stage and the focus value at each position on the surface of the first substrate when the first substrate is placed on the second substrate stage to determine whether there is the foreign substance on the surface of each of the first substrate stage and the second substrate stage based on the calculated difference.

6. The determining apparatus according to claim 5, wherein the controller is configured to determine that there is no foreign substance on the surface of each of the first substrate stage and the second substrate stage when an absolute value of the calculated difference is less than a predetermined threshold value at any position on the surface of the first substrate.

7. The determining apparatus according to claim 5, wherein the controller is configured to determine that there is the foreign substance at a position corresponding to a predetermined position of the surface of the first substrate on the surface of the first substrate stage when the focus value obtained at the predetermined position when the first substrate is placed on the first substrate stage is larger than the focus value obtained at the predetermined position when the first substrate is placed on the second substrate stage by a predetermined threshold value or more, whereas to determine that there is the foreign substance at a position corresponding to the predetermined position on the surface of the second substrate stage when the focus value obtained at the predetermined position when the first substrate is placed on the second substrate stage is larger than the focus value obtained at the predetermined position when the first substrate is placed on the first substrate stage by the predetermined threshold value or more.

8. The determining apparatus according to claim 7, wherein the controller is configured to cause a cleaning unit to clean the surface of the first substrate stage when it is determined that there is the foreign substance on the surface of the first substrate stage, and to cause the cleaning unit to clean the surface of the second substrate stage when it is determined that there is the foreign substance on the surface of the second substrate stage.

9. The determining apparatus according to claim 5, wherein the controller is configured to correct at least one of a position of the surface of the first substrate when the first substrate is placed on the first substrate stage and a position of the surface of the first substrate when the first substrate is placed on the second substrate stage based on a conveying position of the first substrate to the first substrate stage by a conveying unit and a conveying position of the first substrate to the second substrate stage by the conveying unit when the difference is calculated.

10. The determining apparatus according to claim 1, wherein the first substrate is placed on the first substrate stage by being sucked to the first substrate stage by a first substrate chuck provided on the first substrate stage, and wherein the first substrate is placed on the second substrate stage by being sucked to the second substrate stage by a second substrate chuck provided on the second substrate stage.

11. The determining apparatus according to claim 1, wherein the controller is configured to cause an image pickup unit to pickup an image of the surface of the first substrate stage when it is determined that there is the abnormality on the surface of the first substrate stage, whereas to cause the image pickup unit to pickup an image of the surface of the second substrate stage when it is determined that there is the abnormality on the surface of the second substrate stage.

12. The determining apparatus according to claim 1, wherein each of the first detection result and the second detection result includes at least one of detection data of a focus value at each position on the surface of the first substrate and image data of the surface of the first substrate.

13. A measuring apparatus for measuring a state of the surface of the first substrate, comprising:

the first substrate stage on which the first substrate is placed; and the determining apparatus according to claim 1.

14. A pattern forming apparatus for forming a pattern on the first substrate, comprising:

the second substrate stage on which the first substrate is placed; and the determining apparatus according to claim 1.

15. A method for manufacturing an article, comprising:

forming a pattern on the first substrate by using the pattern forming apparatus according to claim 14; and processing the first substrate on which the pattern is formed to obtain the article.

16. A substrate processing system, comprising:

a measuring apparatus configured to measure a state of the surface of the first substrate, the measuring apparatus including the first substrate stage on which the first substrate is placed;

a pattern forming apparatus configured to form a pattern on the first substrate, the pattern forming apparatus including the second substrate stage on which the first substrate is placed; and the determining apparatus according to claim 1.

17. The determining apparatus according to claim 1, wherein the controller is configured to cause an exposure apparatus including the second substrate stage to perform an exposure process on the first substrate in a case where it is determined that the abnormality of the first substrate stage and the second substrate stage does not exist.

18. A determining method comprising:

obtaining a first detection result which is a result of detecting a surface of a first substrate when the first substrate is placed on a first substrate stage;

obtaining a second detection result which is a result of detecting the surface of the first substrate when the first substrate is placed on a second substrate stage; and determining an abnormality of respective surfaces of the first substrate stage and the second substrate stage based on a comparison of the first detection result and the second detection result.

19. A non-transitory computer-readable storage medium storing a program for causing a computer to determine a state of a surface of each of a first substrate stage and a second substrate stage, the program causing the computer to execute:

obtaining a first detection result which is a result of detecting a surface of a first substrate when the first substrate is placed on a first substrate stage;

obtaining a second detection result which is a result of detecting the surface of the first substrate when the first substrate is placed on a second substrate stage; and determining an abnormality of respective surfaces of the first substrate stage and the second substrate stage based on a comparison of the first detection result and the second detection result.

* * * * *